US009905745B2

(12) United States Patent
Gauss et al.

(10) Patent No.: US 9,905,745 B2
(45) Date of Patent: Feb. 27, 2018

(54) DEVICE FOR CONVERTING THERMAL ENERGY TO ELECTRICAL ENERGY

(75) Inventors: Roland Gauss, Simmersfeld-Oberweiler (DE); Stefan Hoffmann, Freudenstadt (DE); Karl Stockinger, Ebhausen (DE)

(73) Assignee: FRIEDRICH BOYSEN GMBH & CO. KG, Altensteig (DE)

( * ) Notice: Subject to any disclaimer, the term of this patent is extended or adjusted under 35 U.S.C. 154(b) by 956 days.

(21) Appl. No.: 13/993,600

(22) PCT Filed: Oct. 26, 2011

(86) PCT No.: PCT/EP2011/005406
§ 371 (c)(1),
(2), (4) Date: Jul. 21, 2014

(87) PCT Pub. No.: WO2012/079662
PCT Pub. Date: Jun. 21, 2012

(65) Prior Publication Data
US 2014/0345662 A1    Nov. 27, 2014

(30) Foreign Application Priority Data
Dec. 14, 2010    (DE) .................. 10 2010 054 432

(51) Int. Cl.
*H01L 35/30*    (2006.01)
*H01L 35/32*    (2006.01)
(Continued)

(52) U.S. Cl.
CPC .............. *H01L 35/30* (2013.01); *F01N 1/083* (2013.01); *F01N 5/02* (2013.01); *F01N 5/025* (2013.01); *F01N 2240/02* (2013.01); *Y02T 10/16* (2013.01)

(58) Field of Classification Search
CPC ......... H01L 35/02; H01L 35/30; F01N 1/083; F01N 1/086; F01N 5/02; F01N 5/025; F01N 2240/02
See application file for complete search history.

(56) References Cited

U.S. PATENT DOCUMENTS 5,823,249 A * 10/1998 Batchelder ............ F28D 9/0025
                                                    165/121
2004/0112571 A1 * 6/2004 Kenny .................... F04B 17/00
                                                    165/80.3
(Continued)

FOREIGN PATENT DOCUMENTS

DE    102006057662 A1    6/2008
DE    102009013535 A1    9/2010
(Continued)

OTHER PUBLICATIONS

Translation of German Search Report dated Jul. 12, 2011 relating to German Patent Application No. 102010054432.9.
(Continued)

*Primary Examiner* — Susan D Leong
(74) *Attorney, Agent, or Firm* — Amster, Rothstein & Ebenstein LLP

(57) ABSTRACT

The invention relates to a device for converting thermal energy to electrical energy, comprising at least one thermoelectric module (19) which has an outer surface having a hot side (20) for contacting a heat source and having a cold side (22) for contacting a heat sink, wherein the hot side of the thermoelectric module is thermally conductively connected to a heat source, in particular an exhaust channel (11) of a combustion engine. The device further comprises a cooling channel (25) through which a cooling fluid can flow and which is thermally conductively connected to the cold side of the thermoelectric module. The cooling channel has at least one opening to the cold side of the thermoelectric
(Continued)

module and is sealed in a fluid-tight manner around the opening with respect to the hot side of the thermoelectric module.

14 Claims, 3 Drawing Sheets

(51) Int. Cl.
*F01N 1/08* (2006.01)
*F01N 5/02* (2006.01)

(56) References Cited

U.S. PATENT DOCUMENTS

| | | | |
|---|---|---|---|
| 2004/0191592 A1* | 9/2004 | Kamachi | B60L 11/1892 429/416 |
| 2007/0045044 A1 | 3/2007 | Sullivan | |
| 2008/0176289 A1* | 7/2008 | Zeng | G06T 7/11 435/91.2 |
| 2010/0000229 A1* | 1/2010 | Tindale | F25B 1/02 62/3.6 |
| 2012/0118344 A1* | 5/2012 | Schluck | F01N 5/025 136/201 |

FOREIGN PATENT DOCUMENTS

| | | |
|---|---|---|
| EP | 1965446 A1 | 9/2008 |
| EP | 2180534 A1 | 4/2010 |
| GB | 737827 A | 10/1955 |
| JP | 2001004245 A | 1/2001 |
| JP | 2002325470 A | 11/2002 |
| JP | 2008274790 A | 11/2008 |
| WO | 2004054007 A2 | 6/2004 |
| WO | 2007026432 A1 | 3/2007 |

OTHER PUBLICATIONS

German Search Reported dated Jul. 12, 2011 relating to German Patent Application No. 102010054432.9.

International Search Report of PCT/EP2011/005406 dated Dec. 20, 2011.

Translation of International Search Report of PCT/EP2011/005406 dated Dec. 20, 2011.

* cited by examiner

DEVICE FOR CONVERTING THERMAL ENERGY TO ELECTRICAL ENERGY

The present invention relates to an apparatus for converting thermal energy into electrical energy comprising at least one thermoelectric module which has an outer surface having a hot side provided for a contact with a heat source and having a cold side provided for a contact with a heat sink, wherein the hot side of the thermoelectric module is in thermally conductive communication with a heat source, in particular with an exhaust gas passage of an internal combustion engine and having a cooling passage which can be flowed through by a cooling fluid and which is in thermally conductive communication with the cold side of the thermoelectric module.

Such apparatus are also called "thermoelectric generators" (TEG) and are used in various types of utilization of exhaust heat. Thermoelectric generators can, for example, be used for exhaust gas heat utilization in internal combustion engines in that some of the thermal energy of the hot exhaust gas flow is converted into electrical energy and is supplied to the onboard power supply of the motor vehicle in order thus ultimately to save fuel. What is decisive for a yield of electrical energy which is as large as possible is, in addition to the efficiency of the thermoelectric module, above all a temperature difference which is as large as possible between the heat source and the heat sink.

The efficiency of conventional thermoelectric generators is, however, relatively small so that there is a need to increase the yield of electrical energy in apparatus of the named kind.

The object is satisfied by an apparatus having the features of claim 1.

In accordance with the invention, the cooling passage has at least one opening facing toward the cold side of the thermoelectric module and is sealed fluid-tight around the opening with respect to the hot side of the thermoelectric module. A functional cooling passage which is closed in a fluid-tight manner is therefore not attached to the thermoelectric module as customary in the technical field, but the seal rather only results by the fastening process, that is an outer boundary of the thermoelectric module is used directly to bound the cooling passage. In this manner, the heat transfer from the cold side of the thermoelectric module into the cooling fluid can be improved since the normally present cooling passage wall is at least omitted as an additional heat transfer resistor in the region of the opening. The invention thus allows an improved heat removal via the flowing cooling fluid and therefore a higher overall efficiency of the thermoelectric generator.

Further developments of the invention are set forth in the dependent claims, in the description and in the enclosed drawings.

The cooling passage is preferably substantially completely open viewed in the direction of the cold side of the thermoelectric module. The cold side of the thermoelectric module is thus—apart from any fastening sections—in full-areal and direct contact with the cooling medium flowing through the cooling passage, whereby a particularly effective heat transfer results.

A surface structure can be provided at the cold side of the thermoelectric module which extends at least regionally over the opening of the cooling passage and which in particular comprises knobs and/or beads. The efficiency of the heat transfer from the cold side of the thermoelectric module into the cooling fluid can hereby be improved. The surface structure preferably extends over the entire opening, that is over the region at which a direct contact takes place between the flowing cooling fluid and the thermoelectric module. Elevated portions or projections of the surface structure can also project through the opening into the cooling passage.

The cooling passage can substantially completely cover the cold side of the thermoelectric module to optimize the cooling effect.

In accordance with an embodiment of the invention, flow guide walls which extend transversely to the cold side are arranged in the cooling passage. The flow guide walls can be in fluid-tight contact with the cold side of the thermoelectric module after the attachment of the cooling passage to the thermoelectric module. The cooling fluid can be guided along a predefined path over the cold side of the thermoelectric module by the flow guide walls during operation. The fastening of the cooling passage to the thermoelectric module can take place with force-transmission or with material continuity. The cooling passage is preferably attached in a force-transmitting manner to the thermoelectric module in a region thereof close to the margin.

The flow guide walls can in particular define a meandering flow path over the cold side of the thermoelectric module. In such an embodiment, the cooling fluid can take up a particularly large amount of heat from the cold side of the thermoelectric module during the flowing through of the cooling passage.

Alternatively, the flow guide paths can also be configured such that a fluid flowing through the cooling passage is excited to form a chaotic flow.

In accordance with a preferred embodiment of the invention, the flow guide walls are attached with force transmission or with material continuity to the thermoelectric module and/or to the cooling passage. In this manner, leak flows can be avoided and a good guidance of the cooling medium over the cold side of the thermoelectric module results.

An apparatus in accordance with the invention can furthermore comprise a plurality of thermoelectric modules which are arranged next to one another and to which respective cooling passages are attached. A plurality of thermoelectric modules of the same kind as well as cooling passages of the same kind can preferably be used. The apparatus can thus be adapted in a simple manner to different applications, in particular to exhaust gas passages of different sizes and different shapes.

The cooling passages of the plurality of thermoelectric modules can be connected in series from a technical flow aspect. Alternatively, the cooling passages of the plurality of thermoelectric modules can be connected in parallel from a technical flow aspect, with means being provided for dividing a common cooling fluid supply flow into a plurality of individual cooling fluid flows for feeding the cooling passages. A distributor line or a distributor pipe can be used, for example, as means for the splitting. It can be prevented by a parallel connection of a plurality of cooling passages that an undesirably large temperature gradient is formed from the inlet side to the outlet side along the exhaust gas flow path.

The cooling passages can be attached in a fluid-tight manner to a housing, in particular to a trough-like or half-shell-like housing, for the thermoelectric module. The housing protects the thermoelectric module from damage and can simultaneously serve for its fastening to the exhaust gas passage.

The invention further relates to an apparatus for utilizing exhaust gas heat in an internal combustion engine, wherein at least one apparatus for converting thermal energy into electrical energy such as described above is attached to an exhaust gas passage of the internal combustion engine and wherein an electrical output connector of the thermoelectric module is connected to an electrical energy store associated with the internal combustion engine. The electrical energy store can, for example, be the main battery of a motor vehicle. The generator can be relieved by the infeed of electrical energy into the main battery so that a fuel saving results overall in the operation of the motor vehicle.

The invention further relates to an exhaust gas system for an internal combustion engine, in particular in a motor vehicle, having an apparatus for utilizing exhaust gas heat such as described above.

A plurality of thermoelectric modules which are arranged next to one another and have respective cooling passages can be attached to a component of the exhaust gas system, with a common cooling fluid inflow line and a common cooling fluid outflow line extending in parallel to the flow direction of the exhaust gas. A simple design hereby results, on the one hand, since all the thermoelectric modules and thus all the cooling passages are fed by a single common line. On the other hand, an efficient cooling is ensured with respect to the surface of the exhaust gas system component since all the individual modules are flowed through separately and thus undesirably high temperature gradients are avoided.

In accordance with a further embodiment of the invention, at least two thermoelectric modules having respective cooling passages are attached to opposite sides of a component of the exhaust gas system. A flattened section of an exhaust gas passage can, for example, be provided with an arrangement of thermoelectric modules at both the upper side and the lower side. The heat transfer from the exhaust gas to the hot sides of the thermoelectric modules can hereby be further improved.

An exhaust gas system in accordance with the invention can also comprise means for branching a first exhaust gas passage of the exhaust gas system into two parallel part passages and for leading together the part passages at their downstream ends to a second exhaust gas passage, with at least one thermoelectric modules being attached to both part passages and with at least one further thermoelectric module being arranged between the two part passages. A separate cooling fluid inflow line and a separate cooling fluid outflow line are preferably associated with each of the parallel part passages. The heat transfer from the exhaust gas into the thermoelectric modules can be further optimized in this manner.

The cooling passage is preferably connected to a cooling circuit of the internal combustion engine. The cooling fluid anyway required for the engine operation is thus used in an advantageous manner to save fuel by means of the exhaust gas heat utilization.

The exhaust gas system can furthermore have at least one muffling device which is designed while taking account of the muffling power of the thermoelectric module. One or more muffling devices can in particular be accommodated in a muffler housing which is integrated into the exhaust gas system at any desired position therein. It is possible due to the muffling effect of the thermoelectric element to dimension the muffling devices smaller in the muffler housing and/or to reduce their number or to completely dispense with additional muffling devices. Since thermal energy is removed from the exhaust gas by the thermoelectric module, not only a cooling of the exhaust gas namely results, but also a reduction in the noise emission.

The invention will be described in the following by way of example with reference to the drawings.

Figure 1:
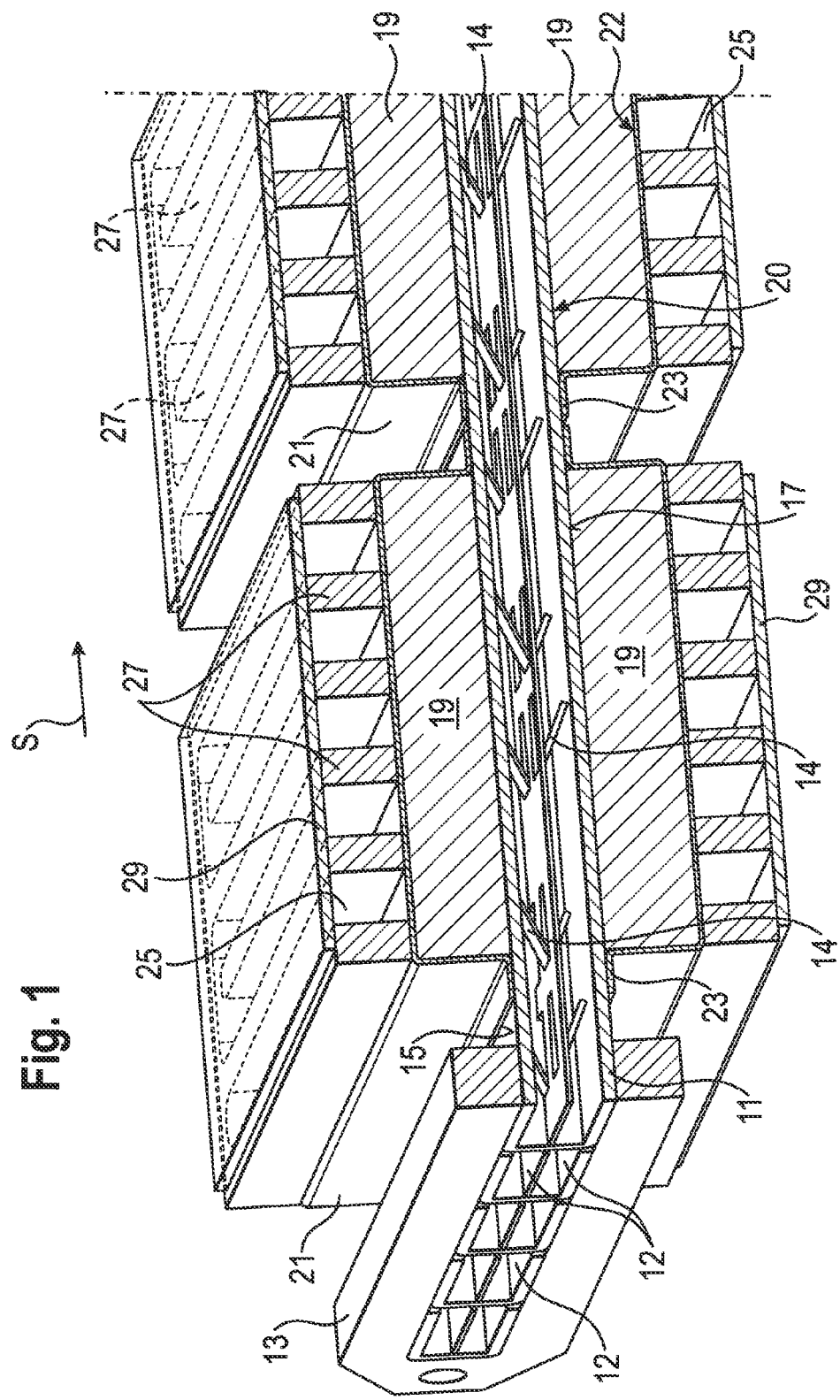
FIG. 1 is a perspective, cut-away representation of an apparatus in accordance with the invention for converting thermal energy into electrical energy which is attached to an exhaust gas passage of an internal combustion engine.
Figure 2:
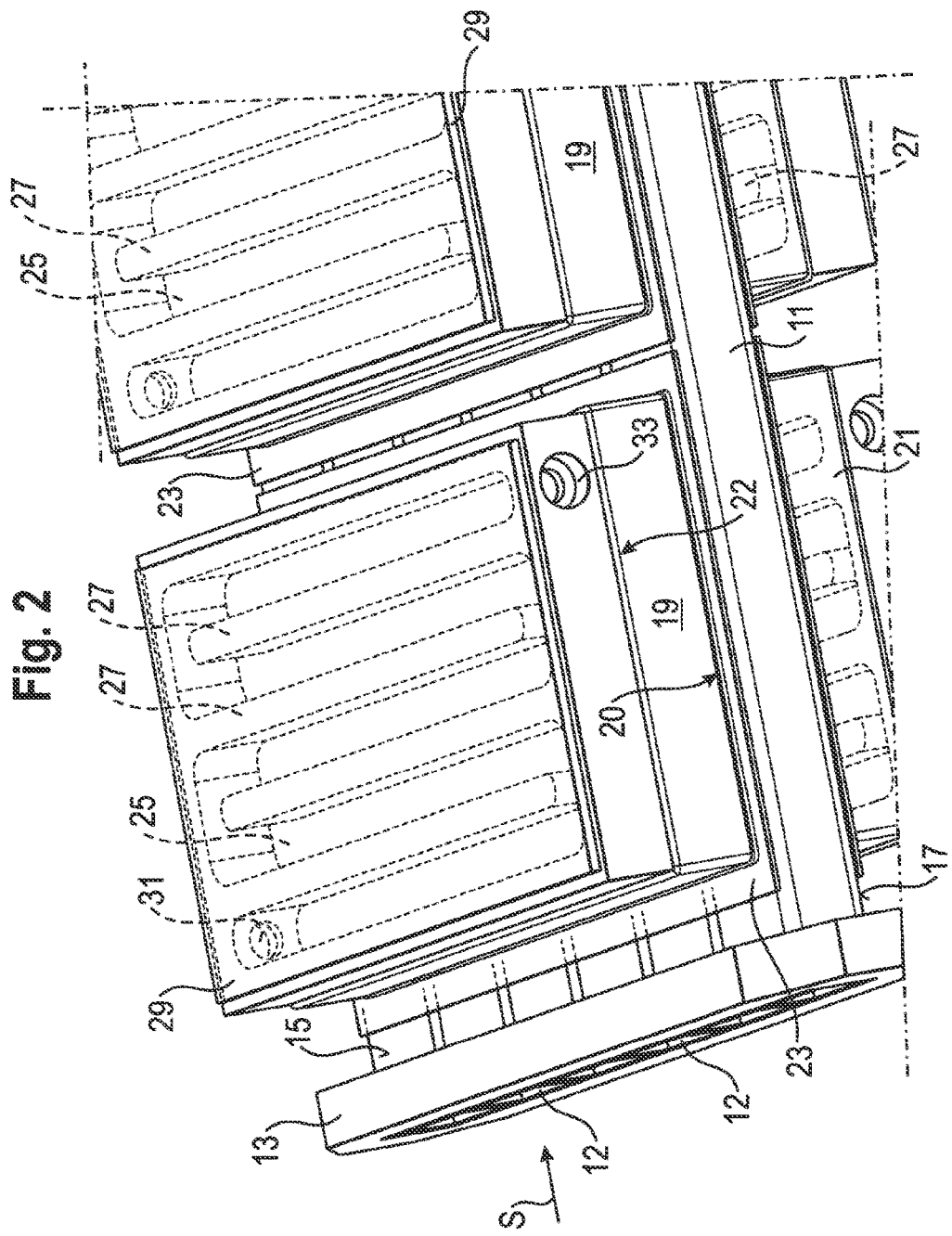
FIG. 2 shows the apparatus in accordance with FIG. 1 in a view from above.

In accordance with FIGS. 1 and 2, an exhaust gas passage 11 serves for guiding a hot exhaust gas from an internal combustion engine, not shown, along a flow direction S into the atmosphere. The exhaust gas passage 11 has a rectangular, flattened cross-section and is split into a plurality of secondary passages 12. A flange 13 is provided at an end face of the exhaust passage 11 at a flow inlet side and serves for connecting the exhaust gas passage 11 to a preceding component of the associated exhaust train. A flange, which is, however, not shown in FIG. 1, is equally provided at the end face of the exhaust gas passage 11 at the flow outlet side. Respective arrangements of thermoelectric modules 19 are provided at the upper side 15 and at the lower side 17 of the exhaust gas passage 11 to convert the thermal energy of the flowing exhaust gas into electrical energy. The thermoelectric modules 19 are each accommodated in a half-shell-like or hat-like housing 21 of metal which is attached to the exhaust gas passage 11 by means of fastening flanges 23. Tongue-like eddying elements 14 are provided in the exhaust gas passage 11 for the direct generation of turbulence in the flowing exhaust gas.

Each thermoelectric module 19 is oriented such that the hot side 20 provided for a contact to a heat source faces toward the exhaust gas passage 11. A cooling passage 25 which can be flowed through by a cooling fluid, in particular water, is provided at the opposite cold side 22 of each thermoelectric module 19. Each cooling passage 25 comprises a carrier structure of a plurality of flow guide walls 27 and covers the cold side 22 of the associated thermoelectric module 19 in a substantially full-areal manner. The flow guide walls 27 in this respect preferably extend at a right angle to the cold side 22 of the thermoelectric module 19 and define a meandering flow path. A cover element 29 provides a fluid-tight termination of the cooling passage 25 with respect to the environment at a flat side of the cooling passage 25 facing away from the exhaust gas passage 11. However, such a cover element is not provided at the opposite flat side of the cooling passage 25, that is each cooling passage 25 is substantially completely open viewed in the direction of the cold side 22 of the thermoelectric module 19. The flow guide walls 27 are connected to the housing 21 with material continuity so that the cooling passage 25 is sealed with respect to the hot side 20 of the thermoelectric module 19 despite an open side.

The flow guide walls 27 can be produced from sheet metal, solid material machined in a cutting process such as plastic or in a similar manner. In the example shown, the flow guide passages 27 themselves form, as mentioned, the carrier structure of the cooling passage 25. Alternatively, a frame-like base structure to which the flow guide walls 27 are attached could also be provided for each cooling passage 25.

During operation of the apparatus, cooling water is supplied to each cooling passage 25 which flows over a cooling water inlet 31 (FIG. 2) and which is subsequently guided over the cold side 22 of the thermoelectric element 19 in a meandering flow by means of the flow guide walls 27 before it is led off again at a cooling water outlet 33.

Figure 3:
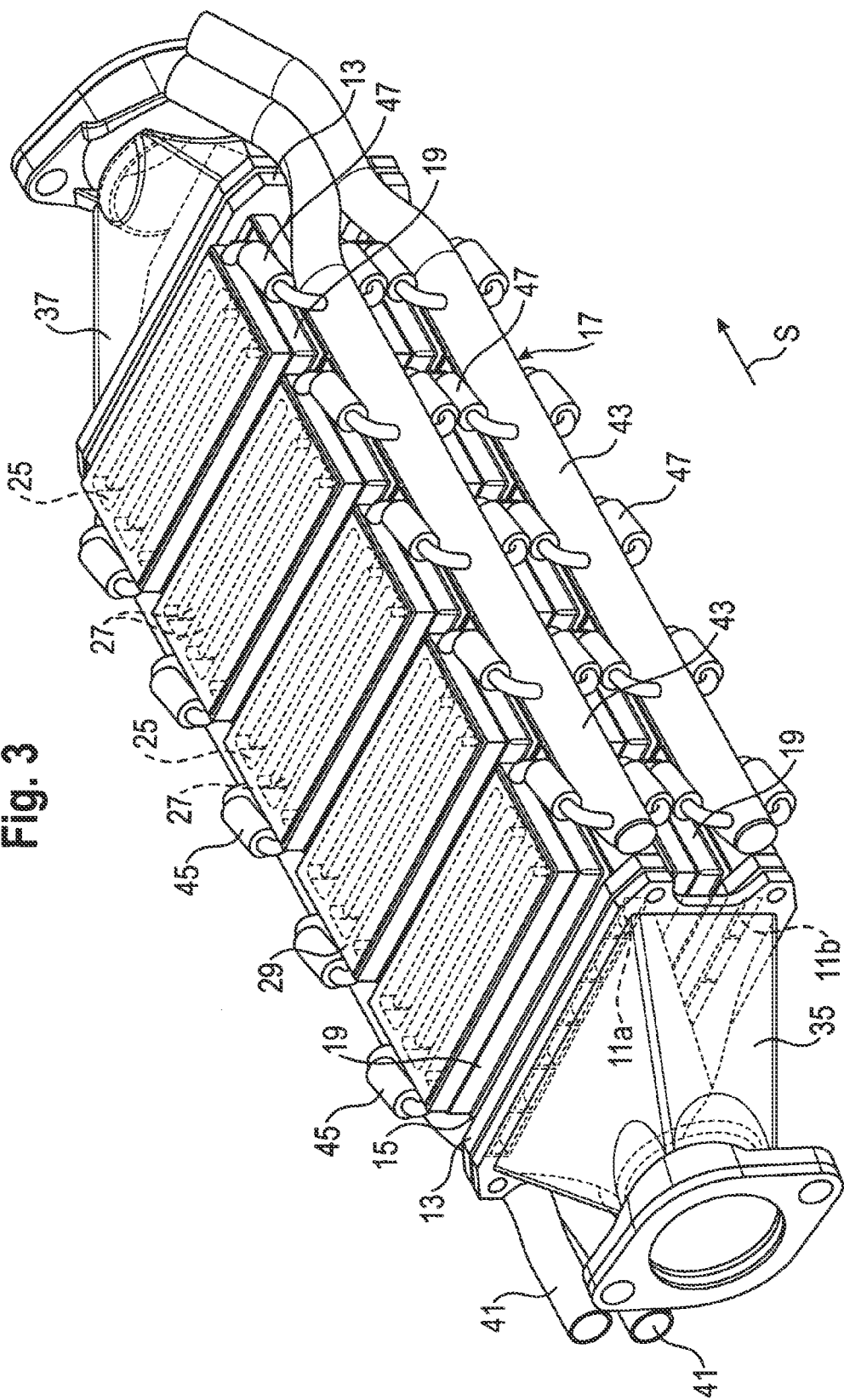
FIG. 3 is a perspective representation of a component of an exhaust gas system to which a plurality of apparatus in accordance with the invention for converting thermal energy into electrical energy are attached.

As can in particular be seen from the overall representation in accordance with FIG. 3, an exhaust train section can comprise an inlet funnel 35, an outlet funnel 37 as well as two parallel part passages 11a, 11b extending therebetween for utilizing the exhaust gas heat in an internal combustion engine. The incoming exhaust gas flow is branched by means of the inlet funnel 35 and is split between the two part passages 11a, 11b. After flowing through the parallel part passages 11a, 11b, the exhaust gas part flows are recombined to an overall flow by means of the outlet funnel 37. Both at their upper side 15 and at their lower side 17, ach of the parallel exhaust gas passages 11a, 11b has an arrangement of thermoelectric modules 19 having respective cooling passages 25 lying next to one another. Two arrangements of thermoelectric modules 19 positioned behind one another along the flow direction S are thus located between the two part passages 11a, 11b. Thermoelectric modules 19 are therefore provided at both sides of each part passage 11a, 11b so that a larger area contributes to the thermoelectric energy conversion in comparison with a single unbranched exhaust gas passage 11.

In this respect, a common cooling fluid inflow line 41 as well as a common cooling fluid outflow line 43 are associated with each of the part passages 11a, 11b and each extend in parallel with the flow direction S of the exhaust gas along the part passages 11a, 11b. Each cooling passage 25 is connected by means of a single inflow line 45 and a single outflow line 47 to the respective associated common cooling water inflow line 41 and to the respective associated common cooling water outflow line 43. In this manner, a parallel connection of the individual cooling passages 25 of each arrangement of thermoelectric modules 19 associated with a flat side of a part passage 11a, 11b results. The formation of an undesirably high temperature gradient along the flow direction S of the exhaust gas is prevented by this parallel connection. The common cooling water inflow line 41 and the common cooling water outflow line 43 of each arrangement of thermoelectric modules 19 are connected to a cooling circuit of the internal combustion engine.

During the operation of the internal combustion engine, the flowing exhaust gas heats the hot side 20 of each thermoelectric module 19, whereas the cold side 22 of each thermoelectric module 19 is cooled by means of the water flowing through the cooling passage 25. In this manner, electrical energy can be recovered from the thermal energy of the exhaust gas which is expediently supplied to the onboard power supply of the associated motor vehicle. The invention can be adapted to many different variants of exhaust trains due to the modular construction. The principle of the parallel part passages as well as of the arrangement of modules on both sides in connection with the parallel connection of the individual modules from a technical flow aspect allows a particularly effective thermal connection of the thermoelectric modules 19 to the exhaust gas passage 11 as well as to the cooling passage 25.

Due to the direct contact between the cooling water in the cooling passage 25 and the cold side 22 of the associated thermoelectric module 19, a particularly good heat transfer from the thermoelectric module 19 to the associated heat sink results so that the apparatus can be operated at high efficiency.

REFERENCE NUMERAL LIST 11, 11a, 11b exhaust gas passage
12 secondary passage
13 flange
14 eddying element
15 upper side
17 lower side
19 thermoelectric module
20 hot side
21 housing
22 cold side
23 fastening lug
25 cooling passage
27 flow guide wall
29 cover element
31 cooling water inlet
33 cooling water outlet
35 inlet funnel
37 outlet funnel
41 cooling water inflow line
43 cooling water outflow line
45 single inflow line
47 single outflow line
S flow direction

The invention claimed is:

1. An apparatus for converting thermal energy into electrical energy comprising
    at least one thermoelectric module which has an outer surface with a hot side provided for a contact to a heat source and with a cold side provided for a contact with a heat sink, the hot side of the thermoelectric module being in thermally conductive communication with the heat source; and said apparatus further comprising
    at least one cooling passage which can be flowed through by a cooling fluid and which is in thermally conductive communication with the cold side of the thermoelectric module, the at least one cooling passage having at least one opening facing toward the cold side of the thermoelectric module so that the cooling fluid is in direct contact with the cold side of the outer surface of the at least one thermoelectric module, the at least one cooling passage being sealed fluid-tight around the opening with respect to the hot side of the thermoelectric module,
    the at least one cooling passage being attached in a fluid-tight manner to a housing for the thermoelectric module.

2. The apparatus in accordance with claim 1, wherein the at least one cooling passage is substantially completely open viewed in the direction of the cold side of the thermoelectric module.

3. The apparatus in accordance with claim 1, further comprising
    a surface structure provided at the cold side of the thermoelectric module which surface structure extends at least regionally over the opening of the at least one cooling passage.

4. The apparatus in accordance with claim 1,
    wherein the at least one cooling passage covers the thermoelectric module in a substantially full-areal manner.

5. The apparatus in accordance with claim 1,
    wherein flow guide walls extending transversely to the cold side are arranged in the at least one cooling passage.

6. The apparatus in accordance with claim 5,
wherein the flow guide walls define a meandering flow path over the cold side of the thermoelectric module.

7. An apparatus in accordance with claim 5,
wherein the flow guide walls are configured such that the cooling fluid flowing through the at least one cooling passage is excited to form a chaotic flow.

8. The apparatus in accordance with claim 7,
wherein the flow guide walls are attached with force transmission or with material continuity to the thermoelectric module and/or to the at least one cooling passage .

9. The apparatus in accordance with claim 1,
wherein the at least one cooling passage comprises a plurality of cooling passages, and the apparatus further comprises a plurality of thermoelectric modules which are arranged next to one another and to which a respective one of the plurality of cooling passages are attached.

10. The apparatus in accordance with claim 9,
wherein the plurality of cooling passages of the plurality of thermoelectric modules are connected in series from a technical flow aspect.

11. An apparatus in accordance with claim 9,
wherein the plurality of cooling passages of the plurality of thermoelectric modules are connected in parallel from a technical flow aspect, with means for splitting a common cooling fluid supply flow into a plurality of individual cooling fluid flows being provided to feed the plurality of cooling passages.

12. An apparatus in accordance with claim 1,
wherein the housing for the thermoelectric module is trough-like or half-shell-like.

13. The apparatus in accordance with claim 1, wherein the hot side of the thermoelectric module is in thermally conductive communication with an exhaust gas passage of an internal combustion engine.

14. The apparatus in accordance with claim 3,
wherein the surface structure comprises knobs and/or beads.

* * * * *